US 6,580,157 B2

(12) United States Patent
Courtenay

(10) Patent No.: US 6,580,157 B2
(45) Date of Patent: *Jun. 17, 2003

(54) ASSEMBLY AND METHOD FOR MODIFIED BUS BAR WITH KAPTON™ TAPE OR INSULATIVE MATERIAL IN LOC PACKAGED PART

(75) Inventor: Robert W. Courtenay, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/828,379

(22) Filed: Apr. 6, 2001

(65) Prior Publication Data

US 2001/0050417 A1 Dec. 13, 2001

Related U.S. Application Data

(63) Continuation of application No. 09/070,464, filed on Apr. 30, 1998, now Pat. No. 6,255,720, which is a continuation of application No. 08/872,403, filed on Jun. 10, 1997, now Pat. No. 5,780,923.

(51) Int. Cl.⁷ ............................................. H01L 23/495
(52) U.S. Cl. ...................... 257/666; 257/676; 438/123
(58) Field of Search .................... 257/666, 676; 438/111, 123

(56) References Cited

U.S. PATENT DOCUMENTS

| 4,862,245 A | 8/1989 | Pashby et al. |
|---|---|---|
| 4,965,654 A | 10/1990 | Karner et al. |
| 5,227,661 A | 7/1993 | Heinen |
| 5,229,329 A * | 7/1993 | Chai et al. |
| 5,233,220 A | 8/1993 | Lamson et al. |
| 5,252,853 A | 10/1993 | Michii |
| 5,294,827 A | 3/1994 | McShane |
| 5,304,842 A | 4/1994 | Farnworth et al. |
| 5,331,200 A | 7/1994 | Teo et al. |
| 5,359,224 A * | 10/1994 | Heinen et al. |
| 5,442,233 A | 8/1995 | Anjoh et al. |
| 5,457,341 A | 10/1995 | West |
| 5,466,888 A | 11/1995 | Beng et al. |
| 5,477,080 A | 12/1995 | Ishisaka et al. |
| 5,539,250 A | 7/1996 | Kitano et al. |
| 5,545,920 A | 8/1996 | Russell |
| 5,550,401 A | 8/1996 | Maeda |
| 5,559,364 A | 9/1996 | Hojyo |
| 5,608,260 A | 3/1997 | Carper et al. |
| 5,780,923 A * | 7/1998 | Courtney |
| 5,821,605 A | 10/1998 | Hong et al. |
| 5,821,606 A | 10/1998 | Murakami et al. |
| 5,859,471 A | 1/1999 | Kuraishi et al. |
| 5,914,530 A * | 6/1999 | Murkakami et al. |
| 5,917,235 A | 6/1999 | Imura |
| 6,255,720 B1 * | 7/2001 | Courtney |

* cited by examiner

Primary Examiner—Sheila V. Clark
(74) Attorney, Agent, or Firm—TraskBritt

(57) ABSTRACT

A semiconductor device is formed from a die and a lead frame having one or more bus bars. Portions of the bus bars are overlain with an electrically insulative material while leaving bonding areas unobstructed, whereby bond wires which span the bus bar(s) may be bonded with a shorter wire and a lower loop, without the danger of shorting to the bus bar(s). The incidence of harmful wire sweep in the encapsulation step is also reduced.

39 Claims, 5 Drawing Sheets

ASSEMBLY AND METHOD FOR MODIFIED BUS BAR WITH KAPTON™ TAPE OR INSULATIVE MATERIAL IN LOC PACKAGED PART

CROSS-REFERENCE TO RELATED APPLICATION

This application is a continuation of application Ser. No. 09/070,464, filed Apr. 30, 1998, now U.S. Pat. No. 6,255,720 B1, issued Jul. 3, 2001, which is a continuation of application Ser. No. 08/872,403, filed Jun. 10, 1997, now U.S. Pat. No. 5,780,923, issued Jun. 14, 1998.

BACKGROUND OF THE INVENTION

1. Field of the Invention

This invention relates generally to the fabrication of semiconductor devices. More specifically, the invention relates to a lead frame with power and/or ground buses for attachment to a semiconductor chip in a leads-over-chip (LOC) configuration.

2. State of the Art

Semiconductor devices combine an integrated circuit on a silicon or gallium arsenide substrate, a die, with a series of conductive leads which is connected to electrical circuits in an electronic apparatus. The conductive leads are part of a thin lead frame and are conventionally connected by wire bonds to electrically conductive bond pads on the die.

A reduction in the package size of the semiconductor device is enabled by a "leads-over-die" configuration as described in U.S. Pat. No. 4,862,245 of Pashby et al. A die is described in which bond pads are arrayed along a generally central axis of the die. A lead frame may then be joined to the active surface of the die on either or both sides of the row(s) of bond pads. An insulative adhesive is used, typically in conjunction with an insulative barrier such as Kapton™ tape, a trademarked product of duPont. Thus, the lead frame will not become shorted to the active surface of the die. The inner portions of the leads which project toward the die bond pads are joined thereto by conventional wire bonding techniques, typically using thin gold or alloy wires.

Efforts to improve the electronic characteristics of the semiconductor device and reduce the package size have led to the development of lead frames having power buses and/or ground buses, as described in U.S. Pat. No. 5,233,220 of Lamson et al., U.S. Pat. No. 5,227,661 of Heinen, U.S. Pat. No. 5,539,250 of Kitano et al., and U.S. Pat. No. 5,545,920 of Russell, for example. The buses are positioned adjacent the row(s) of bond pads on the die. As shown in these patent publications, bond wires extending from the die bond pads to the inner portions of the leads, i.e. fingers of the lead frame, must span a bus, significantly increasing the risk of shorting. In order to avoid such shorting, the bonding technique requires precise placement of the wire with a looping height high enough to avoid shorting with the bus, yet low enough (with as short a wire as possible) to avoid wire sweep during the encapsulation of the die and a portion of the lead frame. In wire sweep, the flow of viscous encapsulant over the device "sweeps" wires laterally, causing shorting between wires and/or bond breakage.

Several solutions have been proposed for avoiding the very precise techniques required when such buses are used.

It is possible to configure the lead frame so that a bus is on one side of the die bond pad row, and all other lead fingers approach the bond pad row from the opposite side. This has several distinct disadvantages:

1. If more than one bus bar is to be used, e.g. power and ground, bond wires will still have to cross one of the bus bars; and
2. The number of leads which may be accommodated by the device is limited, unless the chip size is significantly increased.

In U.S. Pat. No. 5,331,200 of Teo et al., bond wires are avoided entirely by using lead frame fingers which extend to the bond pads of the LOC die and are directly attached to them by inner lead bonding (ILB). The bus bar is positioned away from the die bond pads. The bus bar is elevated above the lead frame fingers and crosses them. The bus has its own "fingers" which are directly attached to the appropriate bond pads on the die. As disclosed, an insulating tape may be inserted between the bus fingers and the other lead frame fingers to prevent shorting therebetween.

The multilevel lead frame of Teo et al. introduces several problems. First, the multilevel lead frame must be made in several parts which are then joined with adhesive tape. This is an additional critical step in the process, requiring special equipment and precision techniques.

Second, a single tape automated bonding (TAB) step will not accommodate placement of both the main lead frame and the second level bus. A second TAB step would be required.

Third, the ILB bonding process may subject the die to greater levels of thermal shock than desired in attempting to compromise the bond formation requirements between the high temperature, pressure, and bonding time required for improved joint reliability and the need to limit exposure of the die to these conditions to avoid die degradation. In ILB bonding, a hot (300° to 600° C.) thermode applies pressure between the TAB leads and the bond pads of the die, which may be excessive and damage the die.

It is proposed in U.S. Pat. No. 5,252,853 of Michii that die terminals to be bused, e.g. power or ground, have bond pads in an inner row, and other bond pads be arrayed in rows outside of the bused terminals. The bus bars are positioned to overlie the inner rows and to be directly joined thereto. The signal leads are directly joined to the outer rows of bond pads. Thus, no wires or signal leads cross over (or under) a bus.

The completely successful bonding of a series of power and/or ground bond pads to an overlying bus bar is difficult.

In another proposed solution to wire-to-bus grounding, U.S. Pat. No. 5,550,401 of Maeda uses a bus bar remote from a row of die bond pads, and elevated above the lead frame fingers. A series of bus bar fingers includes a 180 degree downward bend to supportively elevate the bus bar above the signal lead fingers. The bonding wires do not cross the bus bars.

The bus of Maeda is complex and requires precision bending of the associated bus fingers. High bending stresses are introduced into each of the bus fingers, particularly in view of the very tight radii required. If bent non-uniformly, the bus bar will not be evenly supported, will have localized deformations, and will have a number of differing bending stresses introduced into the bus bar itself.

In each of the patent references cited above, an insulating layer is applied as a tape to portions of the active surface of the semiconductor die, electrically isolating it from the lead frame.

In each of U.S. Pat. Nos. 5,331,200 and 5,550,401 (both previously cited), the underside of the elevated bus bar is coated with an insulating tape to prevent short circuiting with underlying portions of the lead frame.

Of course, once the die has been encapsulated by transfer molding, it is impossible to correct a wire which is broken, shorted, or which has become unbonded. Even though the cost of manufacturing a semiconductor device through the encapsulation step is very expensive, it is rarely economical to attempt repair of a defective wire or wire bond after transfer molding. Removal of the encapsulant without destroying the interconnecting wires is extremely difficult, particularly when the encapsulant is a filled polymer.

Notwithstanding the effort by the semiconductor industry to eliminate the possibility of causing wire short circuits during device manufacturing, the problem has not been satisfactorily resolved. The invention hereinafter described is directed toward providing a simple, effective solution with numerous advantages.

BRIEF SUMMARY OF THE INVENTION

In accordance with the invention, lead frames having integral bus bars for use with leads-over-chip (LOC) and other semiconductor die configurations are constructed with a layer of electrical insulative tape or other coating applied as a liquid or fluid and cured/hardened on the upper surface of the bus bars prior to wire bonding. In the ensuing wire bonding step, the particular height of wire loops is much less critical because inadvertent shorting of the wires to the bus bars is avoided. Thus, the looping heights and wire lengths may be reduced, avoiding subsequent wire sweep during encapsulation.

Furthermore, no extra steps are introduced into the bonding process. In addition, complex processes such as bending the bus bar fingers is avoided.

The resulting proximity of wire loops to the insulated bus bar(s) permits the insulation to limit lateral, i.e., "sweeping," movement of the crossing bond wires during subsequent encapsulation.

Where lead wires are to be bonded to a bus bar, the insulative tape or coating may be simply applied to areas where no bonding is to be done. Alternatively, the insulation may be applied to cover the entire bus bar and then etched to remove selected portions thereof, exposing the bus bar at desired bonding locations.

The insulative material applied to the upper surface of the bus bar(s) may be any suitable well known polymer, such as a polyimide, resin, etc. The preferred insulative material is a polyimide which may be applied either in a flowable form, or more preferably as a preformed tape.

The tape used for insulating an exposed surface of the bus bars is preferably formed of a highly insulative material to which a non-conductive adhesive is applied on one surface. Alternatively, the tape may comprise a material which is self-adhesive to the bus bars under an elevated temperature and/or pressure, or under other controllable conditions.

Insulative tapes useful for the purposes of the invention include a polymeric film having a melting temperature in excess of 175° C. and having no ionizable species such as halides and active metals. One such polyimide film used as an electrical insulator and an α radiation barrier is duPont Kapton™ tape. Other tapes and coatings having similar electrically insulative and adhesion properties may also be used. Where the applied material is to be etched at bond areas, the capability of being readily etched or otherwise selectively removed is required.

While the thickness of the insulative layer may be as much as 8 mils or more, a minimal thickness is preferred, i.e. of the order of about 1 to 4 mils, to minimize cost and device size. This is particularly true when the (preferred) tape form is used. The insulative layer may be applied to the bus bar(s) during manufacture of the lead frame, or applied later prior to wire bonding. As already indicated, the insulative layer may be applied over the bus bar and then etched where wire connections are to be made. Alternatively, the insulative layer may be applied to selected areas to leave bonding areas uncovered. Where the number of wire crossings is very limited, the insulative layer may be applied only to broad areas underlying the planned wire crossing paths.

BRIEF DESCRIPTION OF THE SEVERAL VIEWS OF THE DRAWINGS

The invention is illustrated in the following figures, wherein for the sake of clarity the elements are not necessarily shown to scale.

DETAILED DESCRIPTION OF THE INVENTION

A method and apparatus are provided by the invention to reduce the incidence of wire shorts in LOC and similar type die-to-lead frame packaging where the lead frame includes one or more buses.

Figure 1:
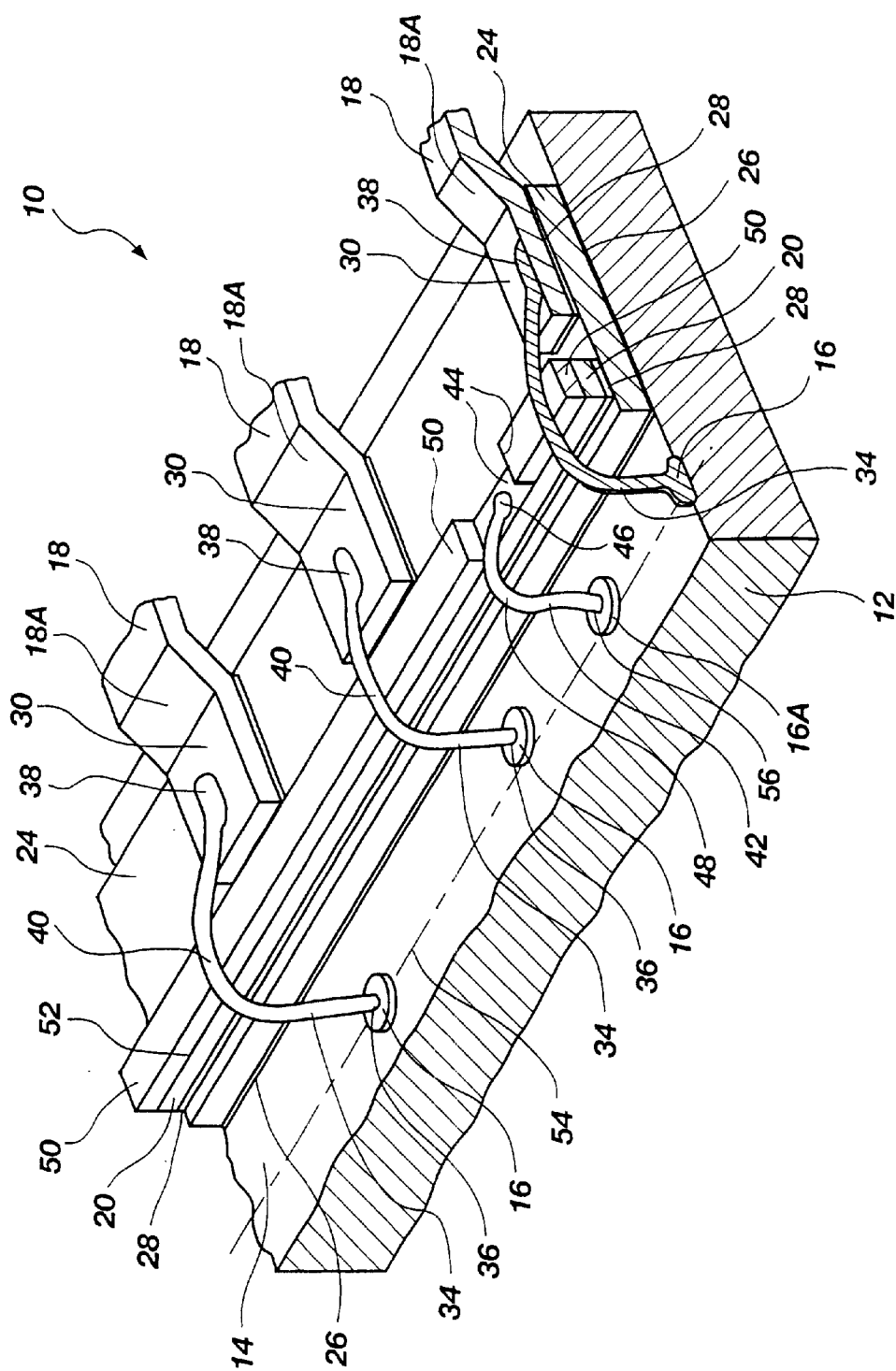
FIG. 1 is a perspective view of a semiconductor device of the invention.

With reference to the drawings, and particularly to FIG. 1, a representative portion of a semiconductor device 10 is illustrated. A die 12 is shown with bond pads 16 on the "active" surface 14 thereof, for electrical connection via leads (signal leads) 18 and one or more bus bars 20 to a circuit (not shown) external to the die. The bond pads 16 are typically arrayed along and proximate to one or more axes 54 on the active surface 14. The axis or axes 54 may be oriented lengthwise and/or widthwise. The leads 18 and bus bars 20 are integrally formed as part of a lead frame as known in the art. Each of the leads 18 includes an inner lead or lead finger 18A having a bonding area 30, the opposite end of the lead 18 comprising an outer lead portion extending externally of the device 10. A typical semiconductor device may have two bus bars 20, one for power and the other for ground.

The leads 18 and bus bar 20 of a "leads-over-chip" (LOC) type device of FIG. 1 are shown separated from the active surface 14 of the die 12 by a first insulative layer 24. The first insulative layer 24 is generally known as an α-barrier and is typically joined to the active surface 14 of the die 12 by a first adhesive 26 and to the underside of the leads 18 and bus bar(s) 20 by a second adhesive 28. The first and second adhesives 26, 28 may be the same or different adhesives of a thermosetting or thermoplastic type.

The first insulative layer 24 is configured to leave uncovered the areas of the active surface 14 having bond pads 16, i.e. on either side of axis 54. Thus, the bond pads 16 are unobstructed to enable access for wire bonding.

As shown, the bond pads 16 and bonding areas 30 of the leads 18 are conductively joined by corrosion resistant wires 34, typically formed of gold and having a diameter of approximately 1 mil. The wires 34 may be joined to bond pads 16 of the die 12 and bonding areas 30 of the signal leads 18 by any of thermocompression bonding, ultrasonic bonding, thermosonic bonding or other wire bonding methods well known in the art. The die bonds 36 and tail bonds 38 in FIG. 1 are illustrated as ball bonds and wedge bonds, respectively, formed by e.g. thermocompression.

In a similar manner, a bond wire 42 is shown bonded as a wire-to-die bond 56 to a die bond pad 16A and as a tail bond 46 to a bonding area 44 on the upper surface of the bus bar 20. The bonds are shown as a thermocompression ball bond and wedge bond, respectively. Because of the shorter required length of the exemplary wire 42, wire 42 has a relatively low loop 48 in comparison to loops 40 of the wires 34 crossing the bus bar 20.

A bus bar 20 is generally connected to a plurality of separated die bond pads 16A and, thus generally, must traverse a substantial portion or all of the length or width of a die 12. Typically, at least one, and usually a considerably larger number of wires 34, 42 must cross the bus bar(s) 20. This is particularly true when the die 12 is a leads-over-chip (LOC) type die, i.e. portions of the leads 18 and/or bus bar(s) 20 overlie an active or major surface 14 of the die. As already indicated, the spanning of a bus bar 20 by leads 18 may lead to difficulties, including:

a. inadvertent shorting of a bond wire 34 to an underlying bus bar 20 or lead finger 18A during the bonding operation; and
   b. to avoid shorting, the wire connections may be formed with higher than usual wire loops 40. The long wires 34 are much more subject to wire sweep during encapsulation of the device 10.

In the improvement represented by the present invention, a layer 50 of polymeric electrical insulative material, such as an α-barrier type polymeric electrical insulative material, is adhered to the upper surface 58 of bus bar 20 during manufacture of the lead frame. Bonding areas 44 of the bus bar 20 to which wires 42 are to be bonded are left uncovered by layer 50, or layer 50 is removed therefrom during lead frame manufacture. It is not generally necessary to cover the entire bus bar(s) 20 with insulative layer 50, as long as areas of the bus bar(s) generally underlying crossing wires 34, 42 are covered to a width ensuring that shorting will not occur. Such width will depend upon the overall wire length, and may be, for example, about 6–15 mils wide as a minimum. Of course, it is unnecessary to delete or remove insulative material layer 50 from the bus bar(s) 20 where no wire is to be bonded thereto.

As will be described further, the insulative material may be applied as a fluid coating to the bus bar(s) 20 or more preferably, applied as a polymeric tape such as Kapton™ polyimide tape with a third adhesive 52 on one side.

Figure 2:
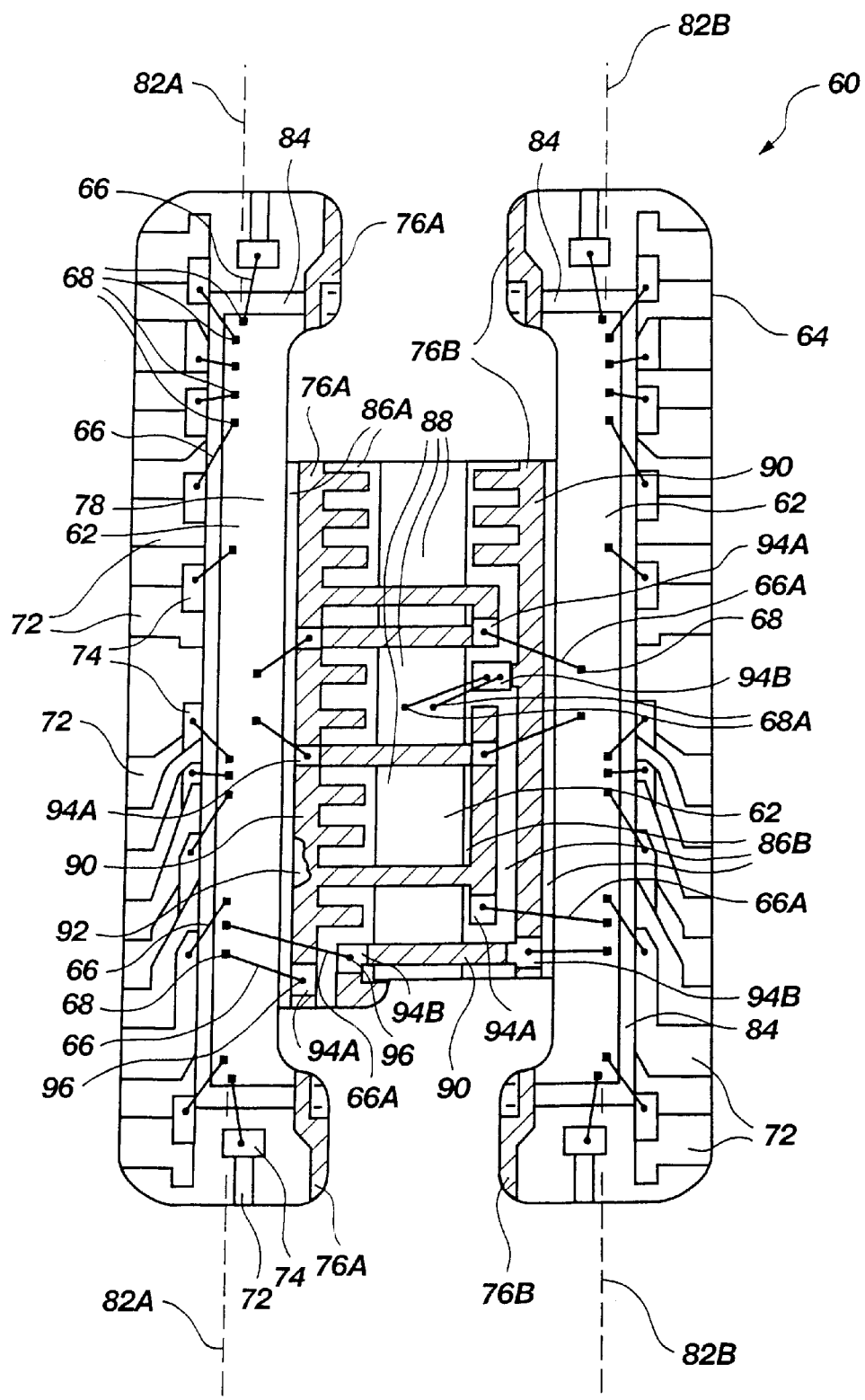
FIG. 2 is a plan view of another embodiment of the semiconductor device of the invention.

Turning now to diagrammatic FIG. 2, a LOC type DRAM (dynamic random access memory) semiconductor device 60 comprises a die 62 and an overlying lead frame 70 (FIG. 3) formed from a suitable metal, such as copper, alloy 42, etc. In the figure, a perimetric line 64 encloses and delineates each of the wire bonds 66 connecting die bond pads 68 with members of the lead frame 70. Bond wires which span one or both of the bus bars 76A, 76B are identified by the numeral 66A. Portions of the lead frame 70 are shown, including inner portions of leads 72 having bonding sites 74, and two bus bars 76A and 76B. The bus bars 76A, 76B are attached to the active surface 78 of the die 62 between two rows 80A, 80B of die bond pads 68, and spaced apart from the two rows 82A, 82B of inner leads 72. Between the bus bars 76A, 76B and the active surface 78 of the die are two intervening elongate insulative members 86A and 86B, both adhesively joined to the die 62 and the overlying bus bars.

The two members 86A, 86B are spaced apart to leave one or more openings 88 for access to bond pads 68A in a central portion of the active surface 78.

In this exemplary device 60, the die 62 is shown adhesively attached to an underlying substrate 84 which may be a die paddle or other package part.

Each of the bus bars 76A, 76B is shown with an upper surface 92 over which pass bond wires identified by indicia 66A. Each bus bar 76A, 76B has its upper surface 92 partially covered with an insulative layer 90 which prevents the shorting of crossing wires 66A to the bus bar. The insulative layer 90 is shown by diagonal lines in FIGS. 2 and 3. As shown, portions of the bus bars 76A, 76B comprise bus bonding areas 94A, 94B, respectively, which are not covered by insulative layer 90, thus permitting access to the upper surface 92 for bonding wires 66 between die bond pads 68 and a bonding area 94A, 94B of a bus bar 76A, 76B. In FIG. 2, bonds to the bus bars 76A, 76B are identified by numeral 96. Any appropriate bonding method may be used for attaching the die bond pads 68 to the lead frame 70, including thermocompression, ultrasonic and thermosonic techniques.

The insulative layer 90 may be configured to:

a. cover only those areas of the bus bars 76A, 76B over which a bond wire 66A is to pass;
   b. cover all or most of the upper surface 92, except where a bond wire 66 is to be attached to the bus bar 76A, 76B; or
   c. be intermediate a. and b. in coverage.

The particular configuration used will be a function of the ease (and cost) of application of the insulative layer 90 to the lead frame 70 to meet the design of the die 62 and specifications of the final packaged product.

The insulative layer 90 may be formed of any material which has sufficient electrically insulating properties to prevent shorting between bond wires 66 and the bus bar(s) 76A, 76B, even when applied in thin layers of about 1–4 mils. The material must also be capable of convenient application to the bus bar(s) during manufacture of the lead frame 70. Some of the insulative polymeric materials which may be used include polyimide, being the preferred material because of ease in handling and its low transmission of α-radiation. The layer of insulative material 90 may be applied as a hardenable fluid, as a paste, or preferably as a thin tape. The tape may have an adhesive on one side, or an adhesive material may be separately applied to the bus bar(s) prior to application of the tape. A material which is readily formed as a tape and provides excellent insulative properties is polyimide. One readily available form of polyimide useful for this purpose is duPont Kapton™ tape, typically available in thicknesses of 1 to 4 mils, and greater. A preferred thickness is about 1 to about 2 mils.

Adhesives which may be used to join insulative layer 90 to the bus bar(s) include epoxies, acrylics, silicones and polyimides. The insulative layer 90 in tape or other form may comprise a polymer which is itself bondable to the bus bars without an additional adhesive material.

It should be noted that while the terms "upper", "lower", "top", "underside" and the like may be used herein, the usual meanings may be reversed where the active surface 14 of the die 12 normally faces downwardly. Such may occur, for example, in a device formed of two dies, one of which has a downwardly facing active surface.

Figure 3:
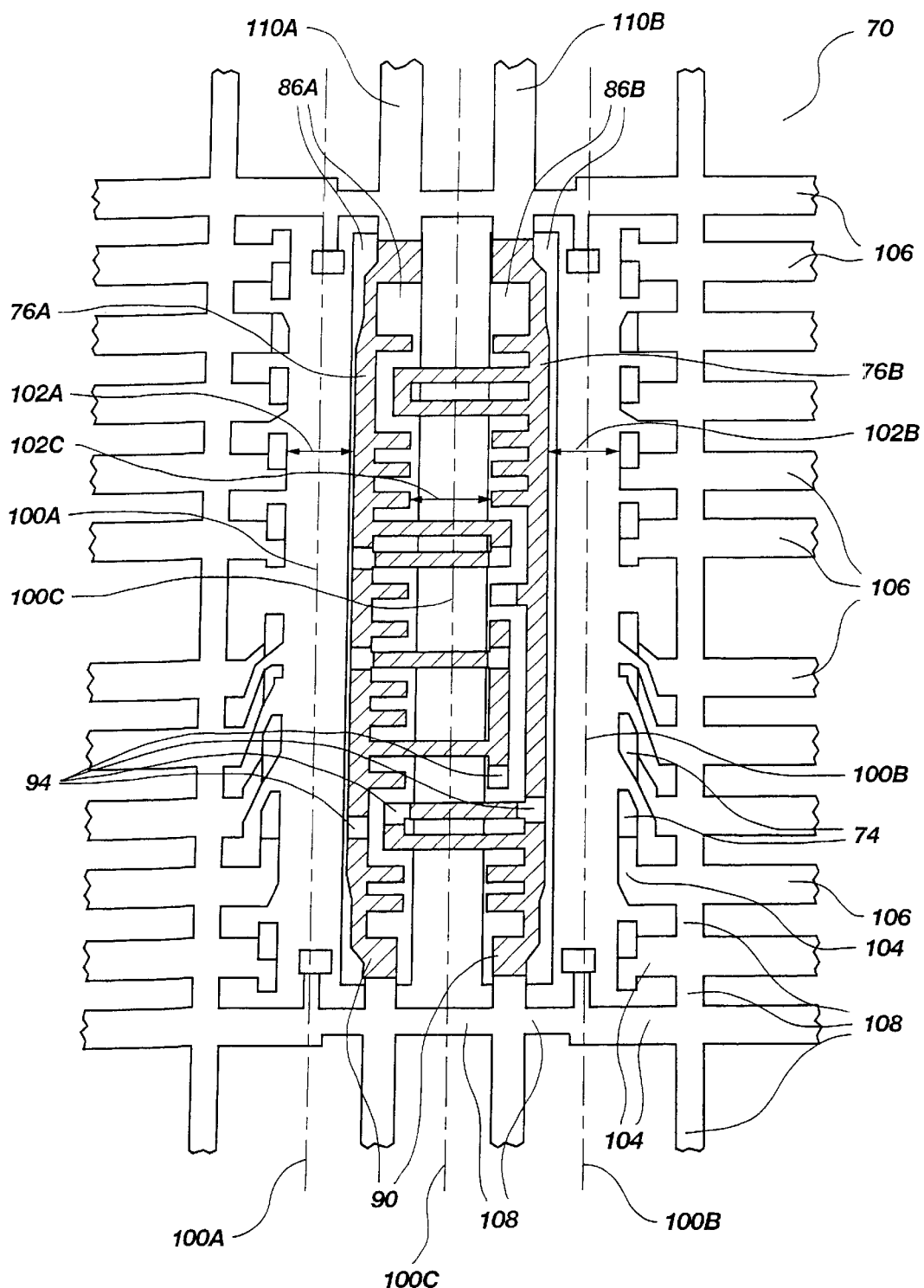
FIG. 3 is a plan view of a lead frame of the invention corresponding to the semiconductor device of FIG. 2.

Looking now at FIG. 3, a major portion of the exemplary lead frame 70 of FIG. 2 is depicted. As shown, the lead frame 70 is ready to be joined to a die 62 (see FIG. 2) and wire-bonded thereto. The lead frame 70 is produced by punching or photolithographic techniques well known in the art. The particular lead frame 70 is configured to overlay a semiconductor die 62 (not shown) which has a plurality of bond pads 68 (see FIG. 2) positioned generally along parallel axes 100A, 100B and 100C. Thus, when applied to a die 62, the lead frame 70 has openings 102A, 102B and 102C, respectively, along axes 100A, 100B and 100C for access of a wire bonding tool to the die bond pads 68.

The lead frame 70 includes a first bus bar 76A and a second bus bar 76B shown as extending through and across a central portion of the die 62, between the longitudinal outer axes 100A and 100B. The bus bars 76A, 76B are positioned generally on either side of central axis 100C and largely spaced therefrom for accessing bond pads located along and near central axis 100C. The exposed, upper surfaces 92 of the bus bars 76A, 76B have bonding sites 94A, 94B to which bond wires will be attached (compare FIGS. 2 and 3). The bus bars 76A, 76B are shown with outer leads 110A, 110B which terminate in external e.g. J terminals, not shown.

The lead frame 70 is shown as including a plurality of lead fingers 104, each having a bonding area 74 to which a wire 66 is to be bonded. In this exemplary semiconductor device, the lead fingers 104 are primarily on either side of axes 100A and 100B, and extend outwardly as outer leads 106 which culminate in e.g. external J terminals (not shown), as known in the art.

The leads 72 and bus bars 76A, 76B are joined to an outer supporting frame, not shown, by temporary cross-members 108 for maintaining the integrity of the entire lead frame 70 until wire bonding is complete. The cross-members 108 are removed after encapsulation to separate the lead frame 70 into a plurality of separate conductive leads (including bus bars) having exterior terminals.

As shown, the lead frame 70 includes two underlying panels 86A, 86B of insulative material, separating (in this case) the bus bars 76A, 76B from the active surface 78 of the die 62 (see FIG. 2). These panels 86A, 86B are adhesively joined to the underside of portions of the lead frame 70 overlying the die 62, and to the active surface 78 of the die. An exemplary material from which panels 86A, 86B are constructed is a polyimide, although other polymers have been found useful.

Overlying portions of the bus bars 76A, 76B and attached thereto is a layer 90 of electrically insulative material as previously described herein. Layer 90 is identified in FIG. 3 as hatched areas of the bus bars 76A, 76B. The insulative layer 90 is adhesively joined to the bus bars 76A, 76B during the lead frame manufacture process. Bus bar bonding areas, i.e. bonding sites 94, comprise areas on the upper surface of the bus bars 76A, 76B which are not covered by insulative layer 90. In the example of FIG. 3, bus bar 76A is shown with six wire bonding sites 94, and bus bar 76B is shown as having three wire bonding sites 94.

The steps in producing the lead frame 70 of the invention may vary, depending upon technical and economic factors.

Figure 4:
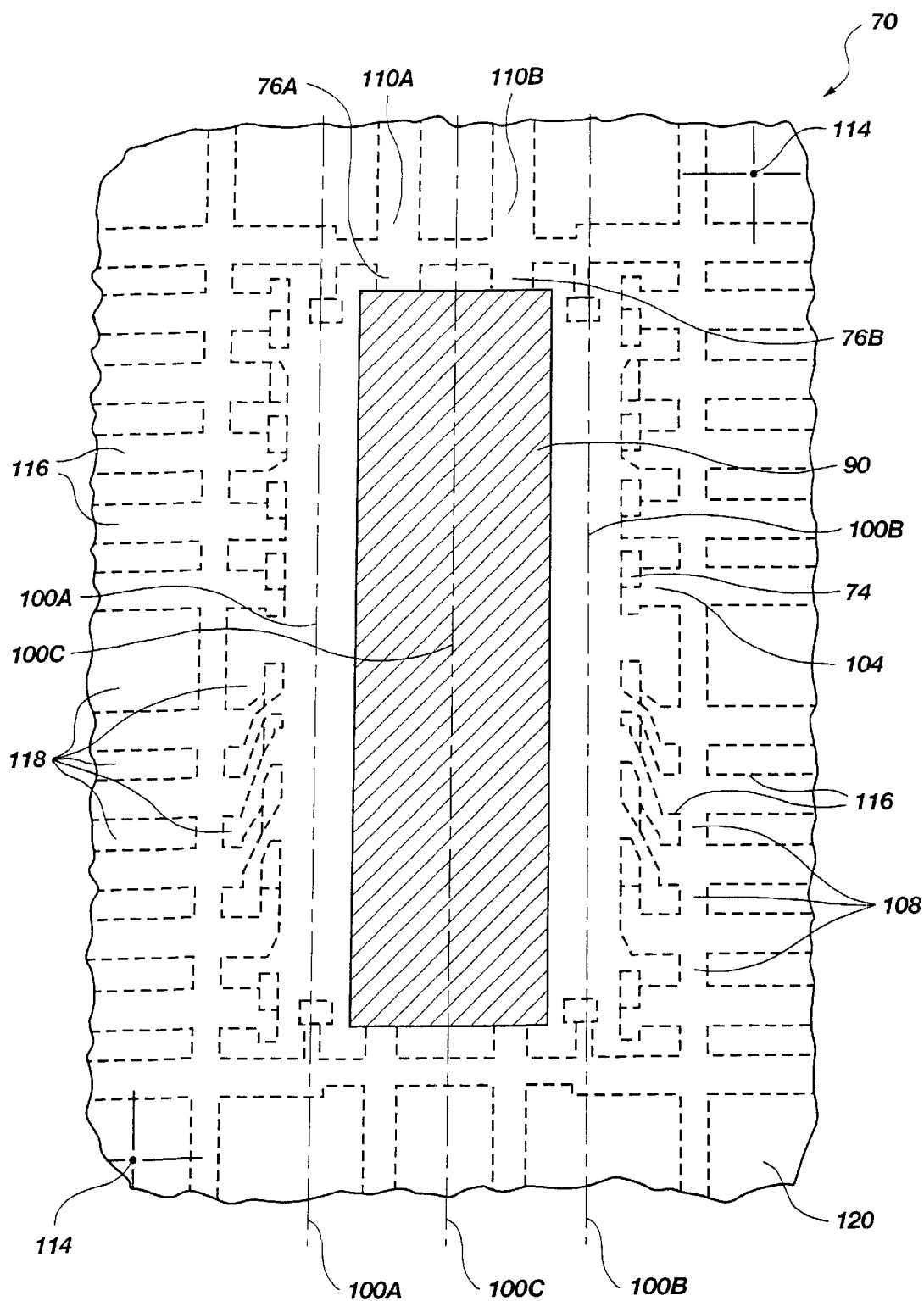
FIG. 4 is a plan view of a lead frame of the invention, following application of a topside insulative layer and prior to pattern formation.

The lead frame 70 may be produced from a single "plate" or layer 120 of conductive metal. As shown in FIG. 4, a central portion of lead frame 70 is indexed by index markings 114 for precise removal of empty spaces 118 of the metal layer 120 to form the pattern 116 of leads and bus bars. The metal layer 120 may be applied to a polymeric backing, not shown, to form a sheet or tape.

A continuous layer 90 of insulative material is adhesively joined to a portion of the metal layer 120 which will become the upper surfaces of underlying bus bars 76A, 76B. The insulative layer 90 may be a polymeric material, such as polyimide, which is applied as a fluid or paste to the metal layer 120. Preferably, the layer 90 is a tape formed of an insulative polymer such as a polyimide. The bus bar portion of the pattern 116 underlies layer 90 and is not shown in FIG. 4. It is, however, as depicted in FIGS. 2 and 3.

In one embodiment, the empty spaces 118 on the lead frame 70 are then excised from the lead frame 70 by e.g. using a punch to cut the metal and attached insulative layer 90 to a desired pattern 116. The result is a pattern 116 of lead fingers 104 with bonding sites 74, outer leads 106 with terminal portions, and one or more bus bars, e.g 76A, 76B, all interconnected by cross-members 108 which provide support for the pattern 116 within the lead frame 70. Thus, the bus bars 76A, 76B are provided with an overlying layer 90 of insulative material.

Next, the insulative layer 90 is etched or otherwise removed from selected locations which become wire bonding sites 94 on the bus bars 76A, 76B.

The insulative members 86A, 86B may then be adhesively applied to the underside of the lead frame 70 where it is to be joined to the active surface 78 of the die 62.

In an alternative method of construction, photolithographic techniques may be used to form the lead frame 70. Empty spaces 18 in the pattern 116, including those in the area covered by layer 90, are removed by etching. The etching step may include those areas which are to become bonding sites 74 on the lead fingers 104 and wire bonding sites 94 on the bus bars 76A and 76B (see FIG. 3).

In a further method of construction, the underside of the metal layer 120 is first joined to a continuous polymeric insulative layer 112 (not shown), e.g. a one-sided polymeric tape, as known in the art. A layer 90 of an insulative polymer, such as polyimide, is then bonded to the upper surface of the metal layer 120, followed by punching out empty spaces 118 to create the desired lead frame pattern 116. An additional a-blocking layer 86 between the die 62 and overlying portions of the lead frame 70 may be used, if required, by the operating specifications of the device 60.

After the completed lead frame 70 is adhesively attached to the die 62, the next steps include wire bonding, removal of the cross-members, testing, encapsulation, and formation of external lead terminals.

Figure 5:
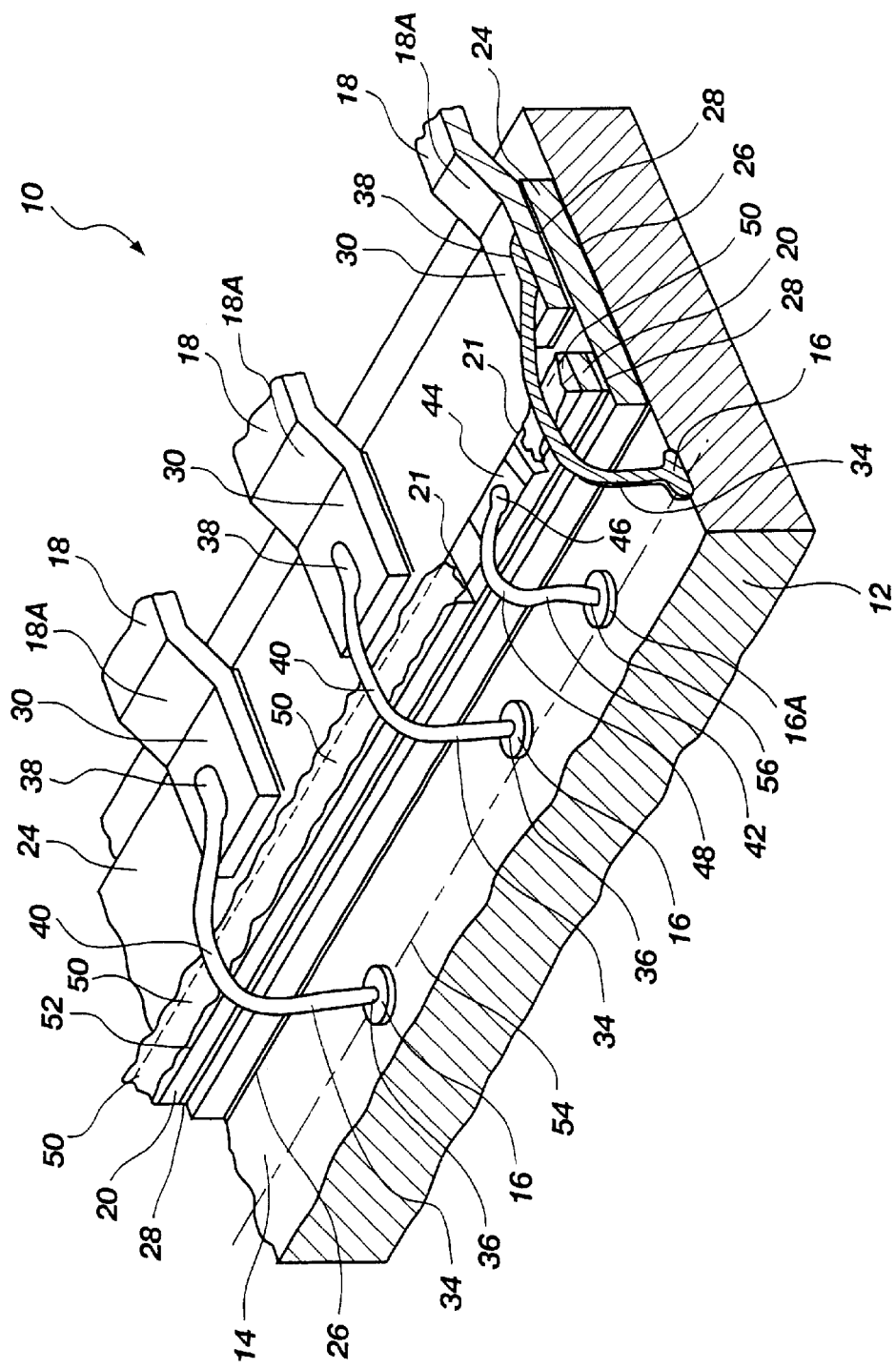
FIG. 5 is a perspective view of a semiconductor device of a second embodiment of the invention.
Figure 1:
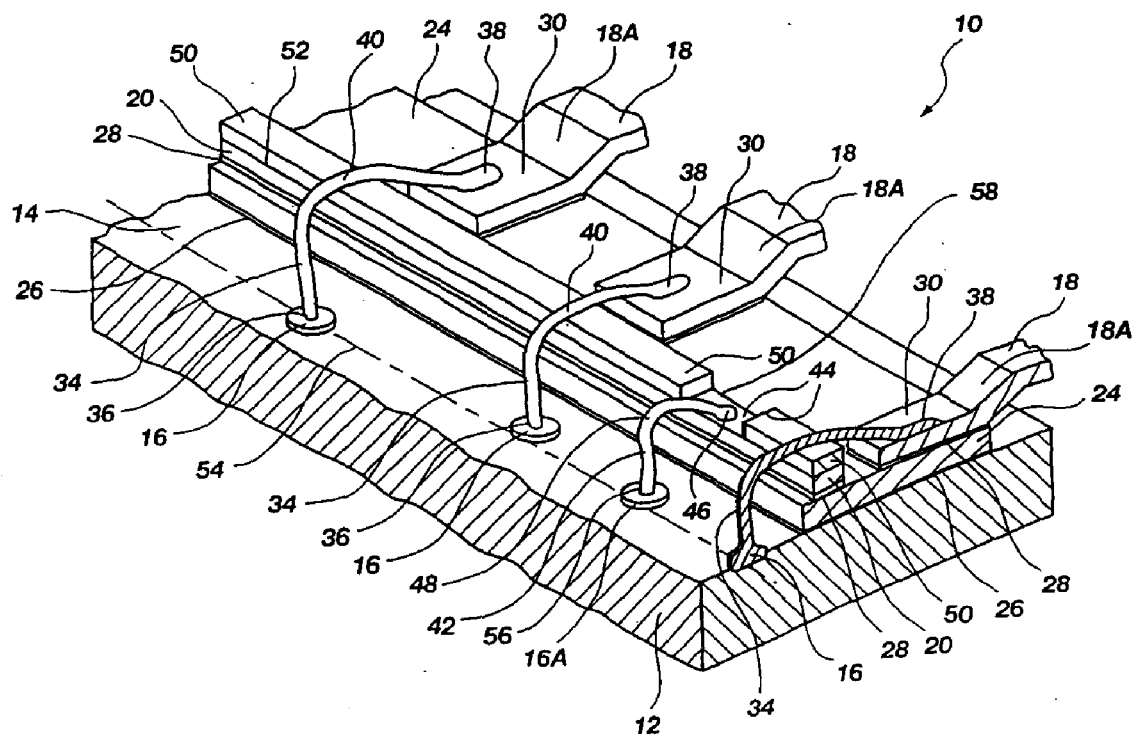
Figure 5:
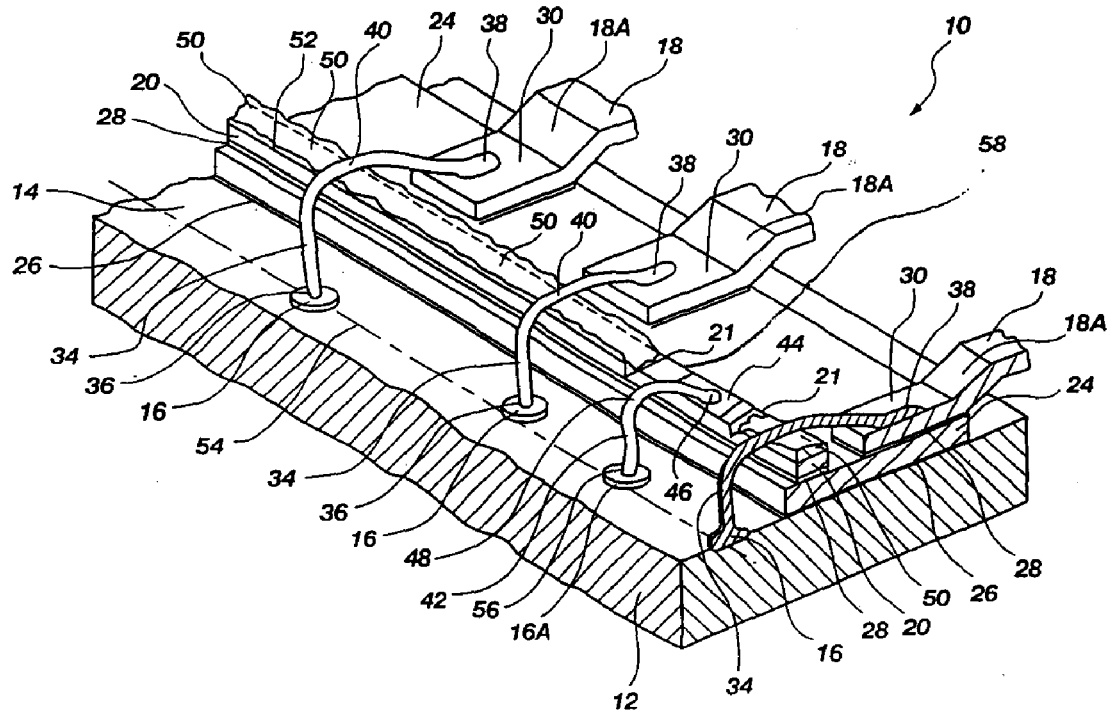

With reference to the drawings, and particularly to FIG. 5, another embodiment of the present invention is illustrated with respect to a representative portion of a semiconductor device 10. A die 12 is shown with bond pads 16 on the "active" surface 14 thereof, for electrical connection via leads (signal leads) 18 and one or more bus bars 20 to a circuit (not shown) external to the die. The bond pads 16 are typically arrayed along and proximate to one or more axes 54 on the active surface 14. The axis or axes 54 may be oriented lengthwise and/or widthwise. The leads 18 and bus bars 20 are integrally formed as part of a lead frame as known in the art. Each of the leads 18 includes an inner lead or lead finger 18A having a bonding area 30, the opposite end of the lead 18 comprising an outer lead portion extending externally of the device 10. A typical semiconductor device may have two bus bars 20, one for power and the other for ground. Each bus bar 20 is formed having a plurality of notches or grooves 21 formed therein extending across the width of the bus bar 20. The notches or grooves 21 may be formed in the bus bar 20 by any suitable means, such as stamping, etching, etc. The notches or grooves 21 are formed on the bus bar 20 adjacent an area of the bus bar where a wire 42 is to be bonded thereto.

The leads 18 and bus bar 20 of a "leads-over-chip" (LOC) type device of FIG. 5 are shown separated from the active surface 14 of the die 12 by a first insulative layer 24. The first insulative layer 24 is generally known as an a-barrier and is typically joined to the active surface 14 of the die 12 by a first adhesive 26 and to the underside of the leads 18 and bus bar(s) 20 by a second adhesive 28. The first and second adhesives 26, 28 may be the same or different adhesives of a thermosetting or thermoplastic type.

The first insulative layer 24 is configured to leave uncovered the areas of the active surface 14 having bond pads 16, i.e. on either side of axis 54. Thus, the bond pads 16 are unobstructed to enable access for wire bonding.

As shown, the bond pads 16 and bonding areas 30 of the leads 18 are conductively joined by corrosion resistant wires 34, typically formed of gold and having a diameter of approximately 1 mil. The wires 34 may be joined to bond pads 16 of the die 12 and bonding areas 30 of the signal leads 18 by any of thermocompression bonding, ultrasonic bonding, thermosonic bonding or other wire bonding methods well known in the art. The die bonds 36 and tail bonds 38 in FIG. 1 are illustrated as ball bonds and wedge bonds, respectively, formed by e.g. thermocompression.

In a similar manner, a bond wire 42 is shown bonded as a wire-to-die bond 56 to a die bond pad 16A and as a tail bond 46 to a bonding area 44 on the upper surface of the bus bar 20 having notches or grooves 21 located adjacent thereto. The bonds are shown as a thermocompression ball bond and wedge bond, respectively. Because of the shorter required length of the exemplary wire 42, wire 42 has a relatively low loop 48 in comparison to loops 40 of the wires 34 crossing the bus bar 20.

A bus bar 20 is generally connected to a plurality of separated bond pads 16A and thus generally must traverse a substantial portion or all of the length or width of a die 12. Typically, at least one and usually a considerably larger number of wires 34, 42 must cross the bus bar(s) 20. This is particularly true when the die 12 is a leads-over-chip (LOC) type die, i.e. portions of the leads 18 and/or bus bar(s) 20 overlie an active or major surface 14 of the die. As already indicated, the spanning of a bus bar 20 by leads 18 may lead to difficulties, including:

a. inadvertent shorting of a bond wire 34 to an underlying bus bar 20 or lead finger 18A during the bonding operation; and
   b. to avoid shorting, the wire connections may be formed with higher than usual wire loops 40. The long wires 34 are much more subject to wire sweep during encapsulation of the device 10.

In the improvement represented by the present invention, a layer 50 of polymeric electrical insulative material, such as an α-barrier type polymeric electrical insulative material, is adhered to the upper surface 58 of bus bar 20 during manufacture of the lead frame. Bonding areas 44 of the bus bar 20 to which wires 42 are to be bonded are left uncovered by layer 50, or layer 50 is removed therefrom during lead frame manufacture. It is not generally necessary to cover the entire bus bar(s) 20 with insulative layer 50, as long as areas of the bus bar(s) generally underlying crossing wires 34, 42 are covered to a width ensuring that shorting will not occur. Such width will depend upon the overall wire length, and may be, for example, about 6–15 mils wide as a minimum. Of course, it is unnecessary to delete or remove insulative material layer 50 from the bus bar(s) 20 where no wire is to be bonded thereto.

As will be described further, the insulative material may be applied as a fluid coating to the bus bar(s) 20, the insulative layer 50 being applied through various well known techniques as described herein. When the insulative layer 50 is applied as a fluid coating, the notches or grooves 21 in the bus bar 20 act as dams to prevent the fluid insulating material from flowing into the bonding area 44 where tail bond 46 of wire 42 is bonded to the bus bar. Suitable fluid insulating layer 50 includes polyimide, UV curable epoxies, aminoproplytriethoxysilane, poly-siloxane, or other known suitable materials.

As a result of the method described above, bonding of wires to bonding sites on opposing sides of a bus bar is readily accomplished without the danger of shorting between the wires and the bus bar(s). All wire bonds may be completed without intervening steps. Bonding of the spanning wires may be done with shorter wires and lower loops. The incidence of destructive wire sweep in encapsulation is reduced.

It is possible to approach the problem of wire-to-bus bar shorting by (a) bonding those wires which are to be attached to a bus bar, (b) removing the device from the bonding machine and coating the upper surface of the bus bar with the insulative layer between the wire bonds, and (c) returning the device to the bonding machine to bond the remaining wire connections, including those wires which are to span the bus bars. None of these approaches are recommended because it requires additional steps and handling, both of which introduce added possibilities for damage to the device. In addition, some of the wires which span a first bus bar are attached to another bus bar. Thus, not all of the wires spanning a bus bar are underlain by an insulative coating, severely limiting the method's effectiveness.

As described herein, the invention provides an improvement in the construction of semiconductor devices. The method may be applied to a wide variety of die and lead frame configurations having at least one bus bond which is spanned by a bond wire, as described herein, and includes typical and atypical LOC and chip-on-board (COB) assemblies. The method is particularly effective for LOC type packaging of dice having bond pads along die edges, as well as within a central die area. The savings effected by the invention are enhanced as the number of spanning wires in the device becomes greater.

It is apparent to those skilled in the art that various changes and modifications may be made in the semiconductor device and methods as disclosed herein without departing from the spirit and scope of the invention as defined in the appended claims. For example, there may be variations in the number, location and arrangement of bus bars, bond pads, and leads in the lead frame.

What is claimed is:

1. A semiconductor assembly, comprising:
   a semiconductor die having a surface having at least two bond pads thereon;
   a first layer of insulative material covering at least a portion of said surface of said semiconductor die;
   a lead frame having a portion thereof attached to a portion of said first layer of insulative material, said lead frame having a plurality of conductive leads, said plurality of conductive leads including inwardly extending lead fingers and at least one conductive bus bar having an upper surface and a lower surface for connection to at least one bond pad of said semiconductor die, at least a portion of the lower surface of said at least one conductive bus bar contacting at least a portion of said first layer of insulative material;
   at least one wire connecting the at least one bond pad to at least one lead finger of said inwardly extending lead fingers;
   at least one other wire connecting the at least one bond pad to said at least one conductive bus bar; and a second layer of electrically insulative material secured to at least a portion of the upper surface of said at least one conductive bus bar.

2. The semiconductor assembly of claim 1, wherein said second layer of electrically insulative material covers at least a portion of said at least one conductive bus bar for preventing shorting of said at least one other wire to said at least one conductive bus bar.

3. The semiconductor assembly of claim 1, wherein said second layer of electrically insulative material substantially covers at least a portion of said at least one conductive bus bar excepting areas for bonding wires thereon.

4. The semiconductor assembly of claim 1, wherein said second layer of electrically insulative material comprises one material of polyimide, epoxy, acrylic, and silicone.

5. A semiconductor assembly, comprising:
   a semiconductor die having a surface having at least two bond pads thereon;
   a first layer of insulative material covering at least a portion of said surface of said semiconductor die;
   a lead frame having a portion thereof attached to a portion of said first layer of insulative material, said lead frame having a plurality of conductive leads, said plurality of conductive leads including inwardly extending lead fingers and at least one conductive bus bar for connection to at least one bond pad of said semiconductor die;
   at least one wire connecting the at least one bond pad of said semiconductor die to at least one lead finger of said inwardly extending lead fingers;
   at least one conductive wire connecting said at least one bond pad of said semiconductor die to said at least one conductive bus bar; and
   a second layer of insulative material secured to at least a portion of an upper surface of said at least one conductive bus bar, said second layer of insulative material comprising a polymide having high a-radiation blocking properties.

6. The semiconductor assembly of claim 5, wherein said second layer of insulative material is applied to at least a portion of said at least one conductive bus bar as one of a tape film.

7. The semiconductor assembly of claim 5, wherein said at least one conductive bus bar includes notches therein adjacent said second layer of insulative material.

8. The semiconductor assembly of claim 7, wherein said insulative material comprises a polyimide.

9. The semiconductor assembly of claim 7, wherein said insulative material comprises Kapton™ polyimide, a trademarked product of duPont.

10. The semiconductor assembly of claim 7, wherein said second layer of insulative material includes a layer of adhesive on one surface thereof for bonding at least a portion of said second layer to at least a portion of said at least one conductive bus bar.

11. The semiconductor assembly of claim 10, wherein said layer of adhesive comprises one adhesive of a polyimide, epoxy, acrylic and a silicone.

12. The semiconductor assembly of claim 5, wherein said at least two bond pads of said semiconductor die includes at least one bond pad positioned in a central portion of said semiconductor die.

13. The semiconductor assembly of claim 5, wherein said second layer of insulative material has a thickness in the range of about 1 to 8 mils.

14. A semiconductor assembly, comprising:
   a semiconductor die having a surface having at least three bond pads thereon;
   a first layer of insulative material covering at least a portion of said surface of said semiconductor die;
   a lead frame having a portion thereof attached to a portion of said first layer of insulative material, said lead frame having a plurality of conductive leads, said plurality of conductive leads including inwardly extending lead fingers and at least one conductive bus bar for connection to said at least three bond pads of said semiconductor die;
   at least one wire connecting at least one bond pad of said at least three bond pads of said semiconductor die to at least one lead finger of said inwardly extending lead fingers;
   at least one conductive wire connecting said at least one bond pad of said semiconductor die to said at least one conductive bus bar; and
   a second layer of insulative material secured to at least a portion of the upper surface of said at least one conductive bus bar, said second layer of insulative material having a thickness in the range of about 1 to 4 mils.

15. The semiconductor assembly of claim 14, wherein said assembly comprises a leads-over-chip (LOC) assembly.

16. A semiconductor assembly, comprising:
   a semiconductor die having a surface having a plurality of bond pads thereon;
   a first layer of insulative material covering at least a portion of said surface of said semiconductor die;
   a lead frame having a portion thereof attached to a portion of said first layer of insulative material, said lead frame having a plurality of conductive leads, said plurality of conductive leads including inwardly extending lead fingers and at least one conductive bus bar for connection to at least one bond pad of said plurality of bond pads, said at least one conductive bus bar interposed between said at least one bond pad of said plurality of bond pads of said semiconductor die and a lead of the plurality of conductive leads of said lead frame, said at least one conductive bus bar having at least one notch therein;
   at least one wire connecting at least one bond pad of said plurality of bond pads to at least one lead finger of said inwardly extending lead fingers;
   at least one conductive wire connecting said at least one bond pad of said plurality of bond pads to said at least one conductive bus bar; and
   a second layer of insulative material secured to a portion of an upper surface of said at least one conductive bus bar.

17. The semiconductor assembly of claim 16, wherein said second layer of insulative material covers said at least one conductive bus bar for preventing shorting of said at least one conductive wire to said at least one conductive bus bar.

18. The semiconductor assembly of claim 16, wherein said second layer of insulative material substantially covers said at least one conductive bus bar excepting bonding areas for bonding wires thereto.

19. The semiconductor assembly of claim 16, wherein said second layer of insulative material comprises one material of polyimide, epoxy, acrylic, and silicone.

20. The semiconductor assembly of claim 16, wherein said second layer of insulative material comprises a polyimide having high a-radiation blocking properties.

21. The semiconductor assembly of claim 16, wherein said second layer of insulative material comprises a polyimide.

22. The semiconductor assembly of claim 16, wherein said second layer of insulative material includes a layer of adhesive on one surface thereof for bonding said second layer of insulative material to said at least one conductive bus bar.

23. The semiconductor assembly of claim 22, wherein said layer of adhesive comprises one material of a polyimide, epoxy, acrylic and a silicone.

24. The semiconductor assembly of claim 16, wherein said plurality of bond pads includes at least one bond pad positioned in a central portion of said semiconductor die.

25. The semiconductor assembly of claim 16, wherein said second layer of insulative material has a thickness in the range of about 1 to 8 mils.

26. The semiconductor assembly of claim 16, wherein said second layer of insulative material has a thickness in the range of about 1 to 4 mils.

27. The semiconductor assembly of claim 16, wherein said assembly comprises a leads-over-chip (LOC) assembly.

28. A lead frame for connection to a semiconductor die having a surface having a plurality of bond pads thereon, said lead frame comprising:
   a lead frame pattern having leads including lead fingers and a bus bar, said bus bar having an upper surface and a lower surface, at least a portion of said lower surface for insulative attachment to at least a portion of said surface of said semiconductor die; and
   a layer of insulative material bonded to at least a portion of the upper surface of said bus bar, portions of said upper surface of said bus bar for connecting to at least one bond pad of said plurality of bond pads on said surface of said semiconductor die and said portions of said upper surface of said bus bar insulated from said semiconductor die, said layer of insulative material bonded to said at least a portion of the upper surface of said bus bar comprising one insulative material of a tape, a hardenable fluid and a paste.

29. The lead frame of claim 28, further comprising a layer of insulative material attached to at least a portion of an underside of a portion of said lead frame configured to overlie said semiconductor die.

30. The lead frame of claim 29, wherein said layer of insulative material attached to at least a portion of an underside of a portion of said lead frame is attached to an underside of said bus bar.

31. The lead frame of claim 28, wherein said layer of insulative material is attached by bonding to at least a portion of the underside of lead fingers of said lead frame.

32. The lead frame of claim 28, further comprising bonding sites on said bus bar, said bonding sites comprising bare metal bonding sites on said bus bar.

33. The lead frame of claim 28, wherein said lead frame includes a plurality of continuous lead frames.

34. A method of making a lead frame for use with a semiconductor die, comprising:
   providing a conductive metal having an upper surface and a lower surface;
   forming a lead pattern on said conductive metal, said lead pattern including:
      a plurality of conductive leads having inwardly directed lead fingers with wire bonding areas for wire bonding to at least one bond pad of said semiconductor die;
      at least one conductive lead comprising a bus bar, said bus bar for wire bonding to said at least one bond pad of said semiconductor die;
      bonding a layer of insulative material to a portion of said upper surface forming at least a portion of at least one bus bar; and
      removing said layer of insulative material from at least one wire bonding area on said upper surface of said at least one bus bar.

35. The method of claim 34, wherein said bonding a layer of insulative material comprises applying a layer of flowable polymeric insulative material onto said upper surface.

36. The method of claim 35, further comprising:
   preventing the layer of flowable polymeric insulative material from flowing along said upper surface.

37. The method of claim 36, wherein said preventing the layer of flowable polymeric insulative material from flowing along said upper surface comprises preventing the layer of flowable polymeric insulative material from flowing along at least a portion of said upper surface of said bus bar.

38. A semiconductor assembly, comprising:
   a semiconductor die having a surface having a plurality of bond pads thereon;
   a first layer of insulative material covering a portion of said surface of said semiconductor die;
   a lead frame having a portion thereof attached to a portion of said first layer of insulative material, said lead frame having a plurality of conductive leads, said plurality of conductive leads including inwardly extending lead fingers and at least one conductive bus bar having a lower surface and an upper surface for connection to at least one bond pad of said plurality of said bond pads, at least a portion of said lower surface attached to said portion of said first layer of insulative material;
   at least one wire connecting said at least one bond pad of said plurality of bond pads to at least one lead finger of said inwardly extending lead fingers;
   said at least one wire connecting said at least one bond pad of said plurality of said bond pads to said at least one conductive bus bar; and
   a second layer of insulative material secured to a portion of the upper surface of said at least one conductive bus bar, said second layer of insulative material including tape.

39. A semiconductor assembly, comprising:
   a semiconductor die having a surface having a plurality of bond pads thereon;
   a first layer of insulative material covering at least a portion of said surface of said semiconductor die;
   a lead frame having a portion thereof attached to a portion of said first layer of insulative material, said lead frame having a plurality of conductive leads, said plurality of conductive leads including inwardly extending lead fingers and at least one conductive bus bar for connection to at least one bond pad of said plurality of said bond pads, said at least one conductive bus bar interposed between a bond pad of said plurality of bond pads of said semiconductor die and a lead of the plurality of conductive leads of said lead frame, said at least one conductive bus bar having at least one notch therein;
   at least one wire connecting at least one bond pad of said plurality of bond pads to at least one lead finger of said inwardly extending lead fingers;
   at least one other wire connecting at least one bond pad of said plurality of said bond pads to said at least one conductive bus bar; and
   a second layer of insulative material secured to a portion of the upper surface of said at least one conductive bus bar, said second layer of insulative material applied to said at least one conductive bus bar as a liquid.

* * * * *

UNITED STATES PATENT AND TRADEMARK OFFICE
CERTIFICATE OF CORRECTION

PATENT NO.    : 6,580,157 B2
DATED         : June 17, 2003
INVENTOR(S)   : Robert W. Courtenay It is certified that error appears in the above-identified patent and that said Letters Patent is hereby corrected as shown below:

Title page,
Item [56], References Cited, U.S. PATENT DOCUMENTS, before "7/1993" delete "*" and before "10/1994" delete "*"

Drawings,
Figure 1, insert -- 58 -- with appropriate lead line indicating the upper surface of the bus bar 20. (as shown on the attached page)
Figure 5, insert -- 58 -- with appropriate lead line indicating the upper surface of the bus bar 20. (as shown on the attached page)

Column 5,
Line 33, change "α-barrier" to -- ά-barrier --

Column 6,
Line 16, change "bonding wires" to -- wire bonds --

Column 7,
Line 41, change "panels" to -- members --

Column 8,
Line 24, change "18" to -- 118 --
Line 36, change "a-blocking" to -- α-blocking --

Column 9,
Line 2, change "a-barrier" to -- α-barrier --
Line 20, change "FIG. 1" to -- FIG. 5 --
Line 50, change "α-barrier" to -- ά-barrier --

Column 11,
Line 14, change "on" to -- one --
Line 15, delete "e"
Line 36, change "a-radiation" to -- α-radiation --
Line 41, after "tape" and before "film" insert -- or --

Column 12,
Line 18, before "upper" change "the" to -- an --
Line 63, change "a-radiation" to -- α-radiation --

Column 13,
Line 48, before "underside" change "the" to -- an --

UNITED STATES PATENT AND TRADEMARK OFFICE
CERTIFICATE OF CORRECTION

PATENT NO.    : 6,580,157 B2
DATED         : June 17, 2003
INVENTOR(S)   : Robert W. Courtenay It is certified that error appears in the above-identified patent and that said Letters Patent is hereby corrected as shown below:

<u>Column 14,</u>
Line 2, before "upper" change "said" to -- an --
Line 6, after "surface" insert -- of said conductive metal --
Line 14, before "bus" insert -- at least one --
Line 60, before "bond" delete "said"

Signed and Sealed this

Twenty-fourth Day of August, 2004

JON W. DUDAS
*Director of the United States Patent and Trademark Office*